United States Patent
Kanaya

(10) Patent No.: US 6,824,933 B2
(45) Date of Patent: Nov. 30, 2004

(54) MASK FOR MANUFACTURING SEMICONDUCTOR DEVICES, METHOD FOR FABRICATING THE SAME, AND EXPOSURE METHOD FOR THE SAME

(75) Inventor: Nobuhiro Kanaya, Sakata (JP)

(73) Assignee: Seiko Epson Corporation (JP)

( * ) Notice: Subject to any disclaimer, the term of this patent is extended or adjusted under 35 U.S.C. 154(b) by 132 days.

(21) Appl. No.: 10/233,282

(22) Filed: Aug. 30, 2002

(65) Prior Publication Data

US 2003/0054263 A1 Mar. 20, 2003

(30) Foreign Application Priority Data

Sep. 6, 2001 (JP) ........................................ 2001-270075

(51) Int. Cl.[7] .............................. G03F 9/00; G03C 5/00
(52) U.S. Cl. ........................................... 430/5; 430/394
(58) Field of Search ........................... 430/5, 322, 323, 430/394; 716/19

(56) References Cited

U.S. PATENT DOCUMENTS 6,218,089 B1 * 4/2001 Pierrat ........................ 430/394
6,274,281 B1 * 8/2001 Chen ............................. 430/5

* cited by examiner

*Primary Examiner*—S. Rosasco
(74) *Attorney, Agent, or Firm*—Harness, Dickey & Pierce, P.L.C.

(57) ABSTRACT

A mask for manufacturing a semiconductor device in accordance with the present invention is equipped with a first mask having separated patterns and a second mask having dense patterns, wherein the first mask and the second mask are exposed under respectively independent illumination conditions to transfer one set of exposure patterns. The first mask includes only isolated patterns wherein adjacent ones thereof do not overlap one another when design data for the exposure patterns is enlarged at a specified magnification, and the second mask includes only dense patterns wherein adjacent ones thereof overlap one another when the design data for the exposure patterns is enlarged at a specified magnification.

12 Claims, 3 Drawing Sheets

MASK FOR MANUFACTURING SEMICONDUCTOR DEVICES, METHOD FOR FABRICATING THE SAME, AND EXPOSURE METHOD FOR THE SAME

BACKGROUND OF THE INVENTION

1. Technical Field

The present invention relates to masks for manufacturing semiconductor devices that are used in a lithography step in a process for manufacturing semiconductor devices, and manufacturing methods and exposure methods for the same.

2. Discussion

In a photolithography step, one mask is normally used to perform an exposure of one exposure pattern. In the world of photolithography, miniaturization of semiconductor elements has been advanced until recent years through implementation of lenses of larger apertures (higher NA: larger aperture number of projection lenses) in exposure apparatuses, improvements in resist material, and use of shorter wavelengths for exposure light sources. However, since device miniaturizations have been in demand at a pace faster than these improvements, techniques called super resolving techniques have been in use in recent years.

There is a technique called a deformed illumination method in the super resolving techniques. For example, for exposing dense patterns, a strong annuli illumination (with an illumination distribution having a lower intensity towards the middle than its outer periphery) is used, and for exposing rough patterns, the exposure is conducted with a low $\sigma$ using a halftone mask. Such techniques are used because they are advantageous in terms of exposure characteristics.

However, such special illumination techniques may involve a phenomenon in which the exposure characteristics substantially vary depending on density or roughness of patterns when the patterns of a size smaller than a wavelength of the exposure light may be printed as a result of the advanced miniaturization. Accordingly, when a single chip contains cells having a low pattern density such as logic cells and cells having a high pattern density such as memory cells mixed with one another, it is difficult in a lithography step to finish the cells having a low pattern density and the cells having a high pattern density at the same time and according to the designed measurements.

This is because proper exposures are different depending on the pattern densities. If the exposure is set for one of the pattern densities such that a resist having those patterns has finished measurements according to the designed measurements, finished measurements of a resist having the other pattern density may substantially differ from the designed measurements, such that no pattern may be resolved, or line widths may become narrower than the desired line widths.

In other words, under an illumination condition that is optimized for the dense patterns, the exposure characteristics for the rough or more separated patterns are extremely deteriorated. On the other hand, under an illumination condition that is optimized for the rough patterns, the exposure characteristics for the dense patterns are extremely deteriorated. Accordingly, an illumination condition cannot be optimized for the patterns having mixed dense and separated patterns. This becomes more significant when the design rules for semiconductor devices become smaller.

The present invention has been made in view of the circumstances described above, and its object is to provide masks for manufacturing semiconductor devices, and fabricating methods and exposure methods for the same, which, when patterns having mixed separated patterns and dense patterns are exposed, provide improved exposure characteristics by conducting multiple exposures under illumination conditions that are optimized for the separated patterns and dense patterns, respectively.

SUMMARY OF THE INVENTION

In accordance with the teachings of this invention, a mask for manufacturing a semiconductor device in accordance with the present invention pertains to a mask for manufacturing a semiconductor device, equipped with a first mask having separated patterns and a second mask having dense patterns, wherein the first mask and the second mask are exposed under respectively independent illumination conditions to transfer one set of exposure patterns, the mask for manufacturing a semiconductor device characterized in that:

the first mask includes only isolated patterns wherein adjacent ones thereof do not overlap one another when design data for the exposure patterns is enlarged at a specified magnification, and The second mask includes only dense patterns wherein adjacent ones thereof overlap one another when the design data for the exposure patterns is enlarged at a specified magnification.

Also, in the mask for manufacturing a semiconductor device in accordance with the present invention, the specified magnification may preferably be 2 times.

A method for fabricating masks for manufacturing a semiconductor device in accordance with the present invention pertains to a method for fabricating masks for manufacturing a semiconductor device, equipped with a first mask having separated patterns and a second mask having dense patterns, wherein the first mask and the second mask are exposed under respectively independent illumination conditions to transfer one set of exposure patterns, the method for fabricating masks for manufacturing a semiconductor device characterized comprising:

enlarging design data for one exposed pattern at a specified magnification, dividing isolated patterns among the enlarged patterns wherein adjacent ones thereof do not overlap one another from dense patterns among the enlarged patterns wherein adjacent ones thereof overlap one another;

forming only the isolated patterns on a mask substrate by a shutter film to fabricate a first mask, and forming only the dense patterns on a mask substrate by a shutter film to fabricate a second mask.

A method for fabricating masks for manufacturing a semiconductor device in accordance with the present invention pertains to a method for fabricating masks for manufacturing a semiconductor device, equipped with a first mask having separated patterns and a second mask having dense patterns, wherein the first mask and the second mask are exposed under respectively independent illumination conditions to transfer one set of exposure patterns, the method for fabricating masks for manufacturing a semiconductor device characterized comprising:

forming a mask for fabricating a mask having exposure patterns with separated patterns and dense patterns mixed with one another, exposing under an illumination condition relevant to the separated patterns using the mask for fabricating a mask as a mask to fabricate a first mask on which separated patterns in a normal size and dense patterns in a size extremely smaller than the normal size are transferred, and exposing under an illumination condition relevant to the dense patterns using the mask for fabricating a mask as a mask to fabricate a second mask on which dense patterns in the normal size and separated patterns in a size extremely smaller than the normal size are transferred.

Also, in the method for fabricating masks for manufacturing a semiconductor device in accordance with the present invention, the specified magnification may preferably be 2 times.

An exposure method in accordance with the present invention comprises:

a step of preparing a mask for manufacturing a semiconductor device, the mask being equipped with a first mask having separated patterns and a second mask having dense patterns;

a step of setting the first mask in an exposure apparatus, and setting an illumination condition with the exposure apparatus relevant to the separated patterns to perform an exposure using the first mask as a mask; and a step of setting the second mask in an exposure apparatus, and setting an illumination condition with the exposure apparatus relevant to the dense patterns to perform an exposure using the second mask as a mask, wherein the first mask includes only isolated patterns wherein adjacent ones thereof do not overlap one another when design data for one set of exposure patterns is enlarged at a specified magnification, and the second mask includes only dense patterns wherein adjacent ones thereof overlap one another when the design data for the one set of exposure patterns is enlarged at a specified magnification.

According to the exposure methods described above, in a stage where masks for manufacturing semiconductor devices are fabricated, data for separated and dense patterns are divided, two masks therefore are fabricated, and the patterns are transferred through multiple exposures with the divided masks under respectively relevant illumination conditions. As a result, the exposure characteristics can be improved compared to the exposure with one mask such as in the conventional exposure method.

An exposure method in accordance with the present invention comprises:

a step of preparing a mask for manufacturing a semiconductor device, equipped with a first mask having separated patterns and a second mask having dense patterns;

a step of setting the first mask in an exposure apparatus, and setting an illumination condition with the exposure apparatus relevant to the separated patterns to perform an exposure using the first mask as a mask; and a step of setting the second mask in an exposure apparatus, and setting an illumination condition with the exposure apparatus relevant to the dense patterns to perform an exposure using the second mask as a mask, wherein a mask for fabricating a mask having exposure patterns with separated patterns and dense patterns mixed with one another is prepared, the first mask is fabricated by exposing under an illumination condition relevant to the separated patterns using the mask for fabricating a mask as a mask to thereby transfer separated patterns in a normal size and dense patterns in a size extremely smaller than the normal size, and the second mask is fabricated by exposing under an illumination condition relevant to the dense patterns using the mask for fabricating a mask as a mask to thereby transfer dense patterns in the normal size and separated patterns in a size extremely smaller than the normal size.

Also, in the exposure method in accordance with the present invention, the specified magnification may preferably be 2 times.

DESCRIPTION OF THE PREFERRED EMBODIMENTS OF THE INVENTION

Embodiments of the present invention will be described below with reference to the accompanying drawings.

Figure 1:
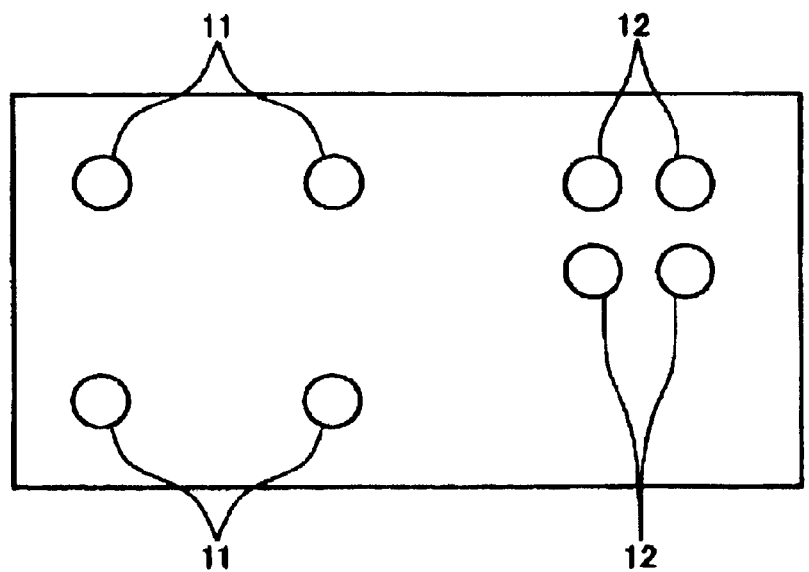
FIG. 1 is a plan view of an example of exposure patterns in accordance with a first embodiment of the present invention.
Figure 2:
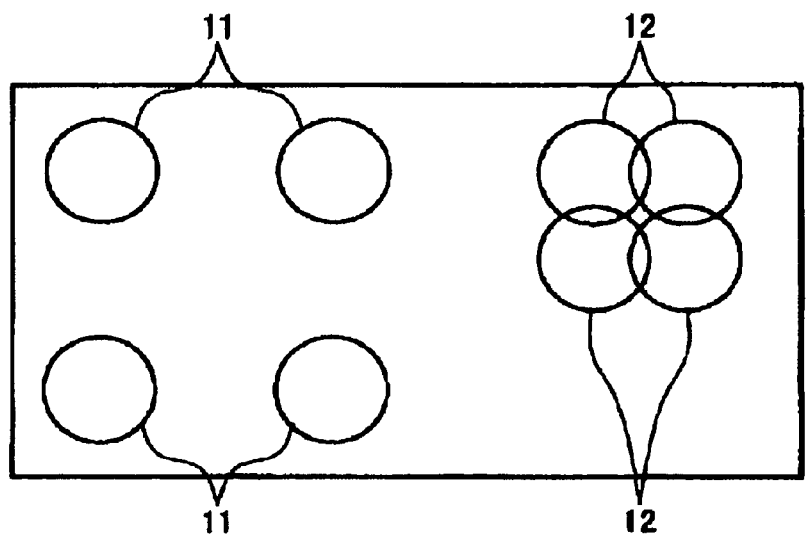
FIG. 2 is a plan view of exposure patterns in which CAD's design data of the exposure patterns shown in FIG. 1 is enlarged in X and Y directions (in a plane direction) respectively at a specified magnification (for example, two times).

FIG. 1 is a plan view of an example of exposure patterns in accordance with a first embodiment of the present invention. FIG. 2 is a plan view of exposure patterns in which CAD's design data of the exposure patterns shown in FIG. 1 is enlarged in X and Y directions (in a plane direction) respectively at a specified magnification (for example, two times).

In the present embodiment, CAD's design data for exposure patterns, which would be normally exposed with one mask, are divided by a certain rule to be described later, a plurality of masks are fabricated, and exposures are conducted under illumination conditions that are optimized for the respective masks, such that the exposure characteristics are improved.

As shown in FIG. 1, the exposure patterns in this example are composed of a plurality of hole patterns 11 and 12. As the CAD's design data for the exposure patterns is enlarged two times in the Y and Y directions, patterns shown in FIG. 2 are obtained.

As shown in FIG. 2, as the hole patterns 11 are enlarged two times, their adjacent patterns do not overlap and are isolated from one another. In contrast, as the hole patterns 12 are enlarged two times, their adjacent patterns partially overlap one another. In this manner, they are divided into two groups; one having the patterns 12 that overlap, and the other having the patterns 11 that do not overlap.

In other words, when the CAD's design data is enlarged two times in the Y and Y directions, and the adjacent patterns are isolated from one another without overlapping, a determination is made that these patterns are separated patterns. When the adjacent patterns overlap one another, a determination is made that these patterns are dense patterns. Accordingly, it can be judged that the hole patterns 11 are separated patterns and the hole patterns 12 are dense patterns. For ease in describing this invention the terms "separated" and "dense" will be used to generally describe the difference in spacing between elements of a first set or type (e.g., relative separated logic cells) and the elements of a second set or type (e.g., more densely populated memory cells).

Figure 3:
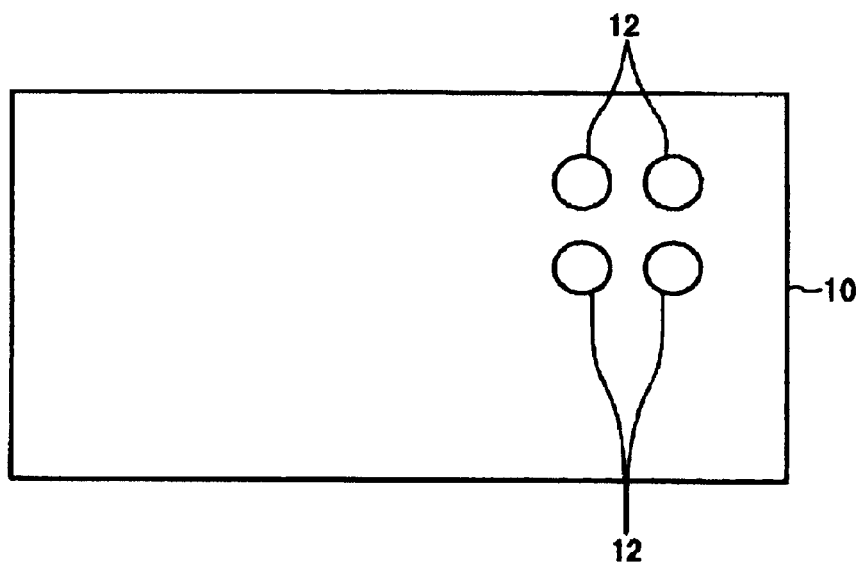
FIG. 3 is a plan view of a dense pattern mask in accordance with the first embodiment of the present invention.
Figure 4:
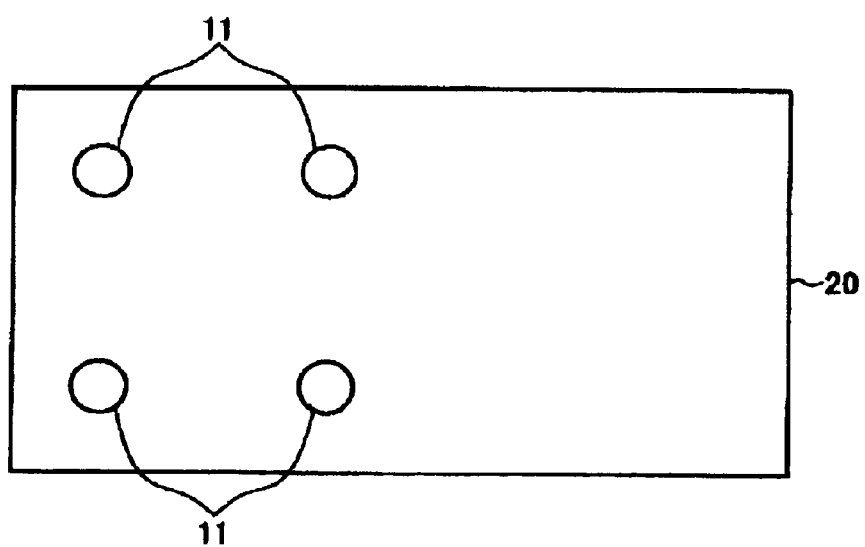
FIG. 4 is a plan view of a separated pattern mask in accordance with the first embodiment of the present invention.

FIG. 3 is a plan view of a dense pattern mask in which the patterns that are judged to be dense patterns in the judging method described above are formed. FIG. 4 is a plan view of a separated pattern mask in which the patterns that are judged to be separated patterns in the judging method described above are formed.

As shown in FIG. 3, the dense pattern mask 10 is a mask for manufacturing semiconductor devices, which is composed of only the dense patterns 12. As shown in FIG. 4, the separated pattern mask 20 is a mask for manufacturing semiconductor devices, which is composed of only the separated patterns 11. By forming two individual masks for the respective separated patterns and dense patterns, an exposure under an illumination condition relevant to the dense patterns can be conducted for the dense pattern mask, and an exposure under an illumination condition relevant to the separated patterns can be conducted for the separated pattern mask. Accordingly, highly miniaturized exposure patterns having mixed patterns such as the separated patterns 11 and dense patterns 12 can be exposed according to the designed measurements.

Next, a description is made as to an exposure method using the two divided masks for manufacturing semiconductor devices shown in FIGS. 3 and 4.

First, a dense pattern mask 10 having only the dense patterns 12 shown in FIG. 3 is prepared, and a separated pattern mask 20 having only the separated patterns 11 shown in FIG. 4 is prepared.

Next, a wafer coated with a photoresist film is prepared, and the wafer is mounted on a wafer stage of an exposure apparatus.

Next, the dense pattern mask 10 is set in the exposure apparatus, and the illumination condition of the exposure apparatus is set to a condition that is relevant to the dense patterns. For example, a large NA, large ρ and strong deformed illumination may preferably be used as the illumination condition.

Next, the photoresist film is exposed using the dense pattern mask 10 as a mask under the aforementioned illumination condition.

Then, the dense pattern mask 10 is dismounted from the exposure apparatus, the separated pattern mask 20 is set in the exposure apparatus, and the illumination condition of the exposure apparatus is set to a condition that is relevant to the separated patterns. For example, a medium NA, small ρ and weak deformed illumination may preferably be used as the illumination condition.

Next, the photoresist film is exposed using the separated pattern mask 20 as a mask under the aforementioned illumination condition. In this manner, the same photoresist is subject to multiple exposures using the multiple masks, whereby more miniaturized patterns can be accommodated than in the case of normal exposure that is conducted with one mask, and more exposure margins can be secured.

In accordance with the first embodiment, in a stage where masks for manufacturing semiconductor devices are fabricated, data for separated and dense patterns are divided to form a plurality of (i.e., two or more) masks, and the patterns are transferred onto a wafer through multiple exposures with the divided masks under different relevant illumination conditions. As a result, the exposure characteristics can be improved compared to the exposure with one mask such as in the conventional exposure method.

Figure 5:
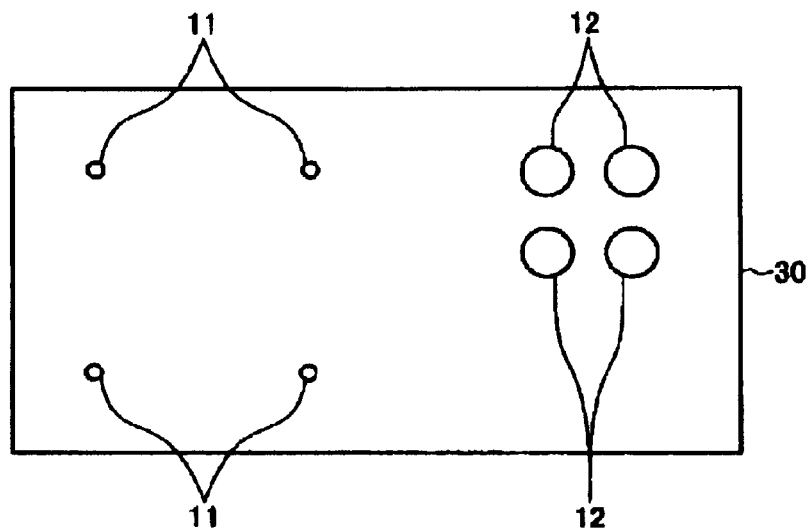
FIG. 5 is a plan view of a dense pattern mask in accordance with a second embodiment of the present invention.
Figure 6:
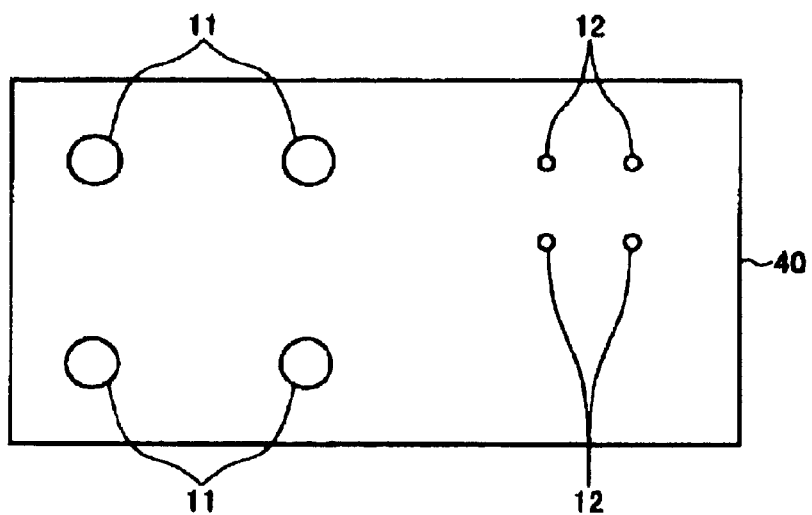
FIG. 6 is a plan view of a separated pattern mask in accordance with the second embodiment of the present invention.

FIG. 5 is a plan view of a dense pattern mask in accordance with a second embodiment of the present invention. FIG. 6 is a plan view of a separated pattern mask in accordance with the second embodiment of the present invention.

In accordance with the present embodiment, exposure patterns, which would normally be exposed with one mask, are divided onto two masks by a method to be described later, and exposures are conducted under illumination conditions that are optimized for the respective masks to improve the exposure characteristics.

First, a method for fabricating masks for manufacturing semiconductor devices in accordance with the second embodiment will be described.

A mask for fabricating a mask having exposure patterns shown in FIG. 1 is formed by an electron beam. The mask for fabricating a mask is formed with separated and dense patterns mixed one another.

Next, a mask substrate is prepared, a shutter film is formed on the entire surface of the mask substrate, and a photoresist film is coated on the shutter film. Next, the mask substrate is mounted on a stage of an exposure apparatus.

Then, the mask for fabricating a mask is set on the exposure apparatus, and the illumination condition of the exposure apparatus is set to a condition that is relevant to the dense patterns. For example, light (i beam or Krf) may be used as the exposure light, and a large NA, large ρ and strong deformed illumination may preferably be used as the illumination condition.

Next, the photoresist film is exposed using the mask for fabricating a mask as a mask under the aforementioned illumination condition, such that a resist pattern is formed on the shutter film. Next, the shutter film is etched using the resist pattern as a mask, and the resist pattern is removed. As a result, a dense pattern mask 30 shown in FIG. 5 is formed. This dense pattern mask 30 includes separated patterns 11 that are formed to be extremely smaller than their normal size, and dense patterns 12 that are formed in their normal size. These patterns are formed in such a manner because the exposure is conducted under an illumination condition that is relevant to the dense patterns. In this case, the dense patterns 12 are transferred in the normal size, but the separated patterns 11 are transferred in a size extremely smaller than their normal size. It is noted that there may be cases where no separated pattern 11 is formed in the dense pattern mask 30.

Next, a mask substrate is prepared, a shutter film is formed on the entire surface of the mask substrate, and a photoresist film is coated on the shutter film. Next, the mask substrate is mounted on a stage of an exposure apparatus.

Then, the mask for fabricating a mask is set on the exposure apparatus, and the illumination condition of the exposure apparatus is set to a condition that is relevant to the separated patterns. For example, light (i beam or Krf) may be used as the exposure light, and a medium NA, small ρ and weak deformed illumination may preferably be used as the illumination condition.

Next, the photoresist film is exposed using the mask for fabricating a mask as a mask under the aforementioned illumination condition, such that a resist pattern is formed on the shutter film. Next, the shutter film is etched using the resist pattern as a mask, and the resist pattern is removed. As a result, a separated pattern mask 40 shown in FIG. 6 is formed. This separated pattern mask 40 includes dense patterns 12 that are formed to be extremely smaller than their normal size, and separated patterns 11 that are formed in their normal size. These patterns are formed in such a manner because the exposure is conducted under an illumination condition that is relevant to the separated patterns. In this case, the separated patterns 11 are transferred in the normal size, but the dense patterns 12 are transferred in a size extremely smaller than their normal size. It is noted that there may be cases where no dense pattern 12 is formed in the separated pattern mask 40.

Next, a description is made as to an exposure method using the two divided masks for manufacturing semiconductor devices shown in FIGS. 5 and 6.

First, a dense pattern mask 30 shown in FIG. 5 is prepared, and a separated pattern mask 40 shown in FIG. 6 is prepared. Next, a wafer coated with a photoresist film is prepared, and the wafer is mounted on a wafer stage of an exposure apparatus.

Next, the dense pattern mask 30 is set in the exposure apparatus, and the illumination condition of the exposure apparatus is set to a condition that is relevant to the dense patterns. The illumination condition is the same as the first embodiment. Next, the photoresist film is exposed using the dense pattern mask 30 as a mask under the aforementioned illumination condition.

Then, the dense pattern mask 30 is dismounted from the exposure apparatus, the separated pattern mask 40 is set in the exposure apparatus, and the illumination condition of the exposure apparatus is set to a condition that is relevant to the separated patterns. The illumination condition is the same as the first embodiment. Next, the photoresist film is exposed using the separated pattern mask 40 as a mask under the aforementioned illumination condition.

When holes have sizes under a sub 0.18 $\mu$m design rule, a phenomenon called a mask error factor (MEF) becomes markedly significant. This is a phenomenon in which minute manufacturing errors at the time of mask fabrication are enlarged at the time of substrate-transfer. In other words, this is a phenomenon in which, when holes are formed while their sizes are reduced as much as possible at the time of mask fabrication, they may be transferred in substantially small sizes or may not be transferred at all at the time of substrate-transfer.

In the second embodiment described above, because of the MEF phenomenon described above, when the patterns on the dense pattern mask 30 shown in FIG. 5 are transferred onto a substrate, the separated patterns 11 that are formed in a small size are not transferred onto the substrate, and only the dense patterns 12 that are formed in the normal size are transferred onto the substrate. Also, when the patterns on the separated pattern mask 40 shown in FIG. 6 are transferred onto the substrate, the dense patterns 12 that are formed in a small size are not transferred onto the substrate, and only the separated patterns 11 that are formed in the normal size are transferred onto the substrate. Accordingly, the masks for manufacturing semiconductor devices shown in FIG. 5 and FIG. 6 can be used in effect as masks exclusively used for dense pattern transfer and for separated pattern transfer, respectively. In this manner, by conducting a multiple-exposure in which one photoresist is exposed with a plurality of masks, the separated patterns 11 and the dense patterns 12 can be exposed under respectively optimized illumination conditions, whereby more miniaturized patterns can be accommodated than in the case of normal exposure that is conducted with one mask, and more exposure margins can be secured.

Also, the second embodiment has an advantage over the first embodiment because it does not require software processing time to divide the CAD data.

It is noted that the present invention is not limited to the embodiments described above, and many modifications can be made and implemented. For example, in the embodiments described above, hole patterns are used as exposure patterns, but patterns having other configurations can be also used.

As described above, the present invention can provide masks for manufacturing semiconductor devices, and fabricating methods and exposure methods for the same, which, when patterns having mixed separated patterns and dense patterns are exposed, provide improved exposure characteristics by conducting multiple exposures under illumination conditions that are optimized for the less dense or separated patterns and the dense patterns, respectively.

The entire disclosure of Japanese Patent Application No. 2001-270075 is hereby incorporated by reference.

What is claimed is:

1. A mask for manufacturing a semiconductor device, equipped with a first mask having separated patterns and a second mask having dense patterns, wherein the first mask and the second mask are exposed under respectively independent illumination conditions to transfer one set of exposure patterns, the mask for manufacturing a semiconductor device characterized in that:

the first mask includes only isolated patterns wherein adjacent ones thereof do not overlap one another when design data for the exposure patterns is enlarged at a specified magnification, and the second mask includes only dense patterns wherein adjacent ones thereof overlap one another when the design data for the exposure patterns is enlarged at a specified magnification.

2. A mask for manufacturing a semiconductor device according to claim 1, wherein the specified magnification is 2 times.

3. A method for fabricating masks for manufacturing a semiconductor device, equipped with a first mask having separated patterns and a second mask having dense patterns, wherein the first mask and the second mask are exposed under respectively independent illumination conditions to transfer one set of exposure patterns, the method for fabricating masks for manufacturing a semiconductor device characterized comprising:

enlarging design data for one exposed pattern at a specified magnification, dividing isolated patterns among the enlarged patterns wherein adjacent ones thereof do not overlap one another from dense patterns among the enlarged patterns wherein adjacent ones thereof overlap one another;

forming only the isolated patterns on a mask substrate by a shutter film to fabricate a first mask, and forming only the dense patterns on a mask substrate by a shutter film to fabricate a second mask.

4. A method for fabricating masks for manufacturing a semiconductor device, equipped with a first mask having separated patterns and a second mask having dense patterns, wherein the first mask and the second mask are exposed under respectively independent illumination conditions to transfer one set of exposure patterns, the method for fabricating masks for manufacturing a semiconductor device characterized comprising:

forming a fabricating mask having exposure patterns with separated patterns and dense patterns mixed with one another, exposing under an illumination condition relevant to the separated patterns using the fabricating mask to fabricate a first mask on which separated patterns in a normal size and dense patterns in a size extremely smaller than the normal size are transferred, and exposing under an illumination condition relevant to the dense patterns using the mask for fabricating a mask as a mask to fabricate a second mask on which dense patterns in the normal size and separated patterns in a size extremely smaller than the normal size are transferred.

5. A method for fabricating masks for manufacturing a semiconductor device according to claim 4, wherein the specified magnification is 2 times.

6. An exposure method comprising:

a step of preparing a mask for manufacturing a semiconductor device, equipped with a first mask having separated patterns and a second mask having dense patterns;

a step of setting the first mask in an exposure apparatus, and setting an illumination condition with the exposure apparatus relevant to the separated patterns to perform an exposure using the first mask as a mask; and a step of setting the second mask in an exposure apparatus, and setting an illumination condition with the exposure apparatus relevant to the dense patterns to perform an exposure using the second mask as a mask, wherein the first mask includes only isolated patterns wherein adjacent ones thereof do not overlap one another when design data for one set of exposure patterns is enlarged at a specified magnification, and the second mask includes only dense patterns wherein adjacent ones thereof overlap one another when the design data for the one set of exposure patterns is enlarged at a specified magnification.

7. An exposure method comprising:

providing a first mask having separated patterns and a second mask having dense patterns;

a step of setting a first mask in an exposure apparatus, and setting an illumination condition with the exposure apparatus relevant to the separated patterns to perform an exposure using the first mask as a mask; and a step of setting the second mask in an exposure apparatus, and setting an illumination condition with the exposure apparatus relevant to the dense patterns to perform an exposure using the second mask as a mask, wherein a fabrication mask for fabricating a mask having exposure patterns with separated patterns and dense patterns mixed with one another is prepared, the first mask being fabricated by exposing under an illumination condition relevant to the separated patterns using the mask for fabricating a mask as a mask to thereby transfer separated patterns in a normal size and dense patterns in a size extremely smaller than the normal size, and the second mask is fabricated by exposing under an illumination condition relevant to the dense patterns using the mask for fabricating a mask as a mask to thereby transfer dense patterns in the normal size and separated patterns in a size extremely smaller than the normal size.

8. A exposure method according to claim 7, wherein the specified magnification is 2 times.

9. A method of making a semiconductor device comprising:

generating an exposure pattern having a plurality of hole patterns;

magnifying the exposure pattern;

detecting a first set of hole patterns which overlap;

detecting a second set of hole patterns which do not overlap;

making a first mask having a hole pattern defined by the first set of hole patterns;

making a second mask having a hole pattern defined by the second set of hole patterns;

exposing a semiconductor wafer with illumination through the first mask at a given illumination condition; and exposing the semiconductor wafer with illumination through the second mask at a different illumination condition;

wherein elements on the semiconductor wafer having different density patterns can be optimally processed.

10. The method of claim 9 wherein the first mask is used to form elements having a dense pattern and the second mask is used to form elements having a more separated pattern.

11. A method of making a semiconductor device having first and second sets of elements, comprising:

making a first mask having under first illumination conditions optimum for the first set of elements, said first mask having a first set of holes for the first set of elements and a second set of significantly smaller holes for the second set of elements;

making a second mask having under different illumination conditions optimum for the second set of elements, said second mask having a second set of holes for the second set of elements and a first set of significantly smaller holes for the first set of elements;

applying photoresist to a surface of a semiconductor wafer;

illuminated the photoresist through the first mask under a given illumination condition to define the first set of elements; and illuminated the photoresist through the second mask under substantially the same illumination condition to define the second set of elements.

12. The method of claim 11 wherein the first mask is used to form elements having a dense pattern and the second mask is used to form elements having a more separated pattern.

* * * * *

UNITED STATES PATENT AND TRADEMARK OFFICE
CERTIFICATE OF CORRECTION

PATENT NO. : 6,824,933 B2
DATED : November 30, 2004
INVENTOR(S) : Soppet et al.

It is certified that error appears in the above-identified patent and that said Letters Patent is hereby corrected as shown below:

Title page,
Item [56], References Cited OTHER PUBLICATIONS, delete the "Buck, et al." citation and insert the following references:

-- Buck, et al., "A Novel Multigene Family May Encode Odorant Receptors: A Molecular Basis for Odor Recognition," *Cell*, 65:175-187 (1991). --

Hla, et al., "An Abundant Transcript Induced in Differentiating Human Endothelial Cells Encodes a Polypeptide With Structural Similarities," *J. Biol. Chem.*, 265(16):9308-9313 (1990).

Xu, et al., "PSGR, a Novel Prostate-specific Gene with Homology to a G Protein-coupled Receptor is Overexpressed Prostate Cancer," *Cancer Research*, 60:6568-6572 (2000).

Wilson, et al., "Orphan G-protein-coupled Receptors: The Next Generation of Drug Targets?," *British J. Pharmacol.*, 125:1387-1392 (1998).

Pitcher, et al., "G Protein-coupled Receptor Kinases," *Annu. Rev. Biochem.*, 67:653-692 (1998).

Stadel, et al., "Orphan G Protein-coupled Receptors: A Neglected Opportunity for Pioneer Drug Discovery," *TIPS*, 18:430-437 (1997).

Edwards, et al., "Localization of G-protein-coupled Receptors in Health and Disease," *TIPS*, 21:304-308 (2000).

Ostrom, et al., "Stoichiometry and Compartmentation in G Protein-coupled Receptor Signaling: Implications for Therapeutic Interventions Involving Gs1," *JPET*, 294(2):407-412 (2000). --

Column 179,
Line 3, delete "fragment of claim 1," and insert -- fragment of claim 10, --.

Signed and Sealed this

Third Day of May, 2005

JON W. DUDAS
*Director of the United States Patent and Trademark Office*